(12) United States Patent
Droege et al.

(10) Patent No.: US 9,000,577 B2
(45) Date of Patent: Apr. 7, 2015

(54) INTERLAYER COMMUNICATIONS FOR 3D INTEGRATED CIRCUIT STACK

(75) Inventors: Guido Droege, Braunschweig (DE); Niklas Linkewitsch, Evessen (DE); Andre Schaefer, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/976,562

(22) PCT Filed: Sep. 30, 2011

(86) PCT No.: PCT/US2011/054440
§ 371 (c)(1),
(2), (4) Date: Jun. 27, 2013

(87) PCT Pub. No.: WO2013/048501
PCT Pub. Date: Apr. 4, 2013

(65) Prior Publication Data
US 2013/0293292 A1    Nov. 7, 2013

(51) Int. Cl.
*H01L 23/02* (2006.01)
*H01L 23/522* (2006.01)
*H01L 25/065* (2006.01)
*H01L 23/64* (2006.01)
*H01L 23/48* (2006.01)

(52) U.S. Cl.
CPC ........ *H01L 23/5223* (2013.01); *H01L 25/0657* (2013.01); *H01L 23/642* (2013.01); *H01L 23/481* (2013.01); *H01L 2223/6622* (2013.01); *H01L 2225/06513* (2013.01); *H01L 2225/06544* (2013.01); *H01L 2224/16145* (2013.01)

(58) Field of Classification Search
USPC .................. 257/686, 678; 327/565
See application file for complete search history.

(56) References Cited

U.S. PATENT DOCUMENTS

| | | | |
|---|---|---|---|
| 5,818,884 A * | 10/1998 | Reymond | 375/354 |
| 6,104,209 A | 8/2000 | Keeth et al. | |
| 6,864,733 B2 | 3/2005 | Anshumali et al. | |
| 2006/0256964 A1* | 11/2006 | Gu et al. | 380/242 |
| 2010/0052826 A1* | 3/2010 | Callahan et al. | 333/24 R |
| 2010/0121994 A1 | 5/2010 | Kim et al. | |
| 2011/0095435 A1 | 4/2011 | Volant et al. | |
| 2011/0121811 A1 | 5/2011 | Dennard et al. | |
| 2011/0248901 A1* | 10/2011 | Alexopoulos et al. | 343/836 |
| 2012/0155559 A1* | 6/2012 | Yamasaki | 375/257 |

FOREIGN PATENT DOCUMENTS

| | | |
|---|---|---|
| KR | 10-2004-0015760 A | 2/2004 |
| KR | 10-2010-0003237 A | 1/2010 |
| WO | 2010/151350 A1 | 12/2010 |

(Continued)

OTHER PUBLICATIONS

International Search Report and Written Opinion received for International Application No. PCT/US2011/054440, mailed on May 2, 2012, 9 pages.

Office Action Received for Taiwan Patent Application No. 101132549, mailed on Jun. 23, 2014, 25 pages including 15 pages of English Translation.

(Continued)

*Primary Examiner* — Phuc Dang
(74) *Attorney, Agent, or Firm* — Green, Howard & Mughal, LLP

(57) ABSTRACT

Some embodiments provide capacitive AC coupling interlayer communications for 3D stacked modules.

14 Claims, 6 Drawing Sheets

(56) References Cited

FOREIGN PATENT DOCUMENTS

WO 2010/151375 A1 12/2010
WO 2013/048501 A1 4/2013

OTHER PUBLICATIONS

International Preliminary Report on Patentability received for International Application No. PCT/US2011/054440, mailed on Apr. 10, 2014, 6 pages.

* cited by examiner

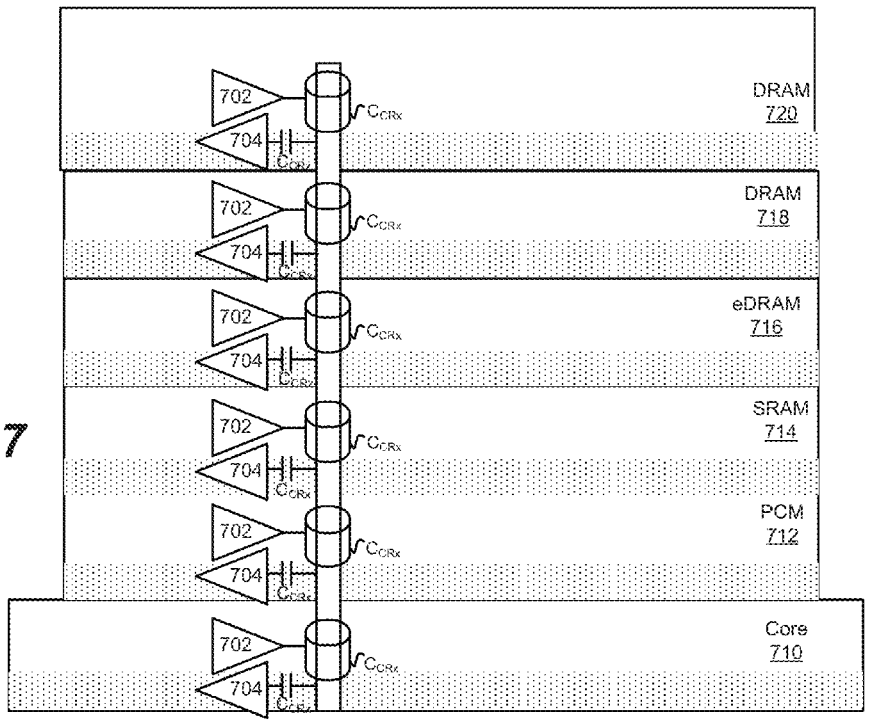
*FIG. 7*
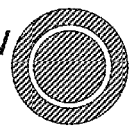
*FIG. 8*

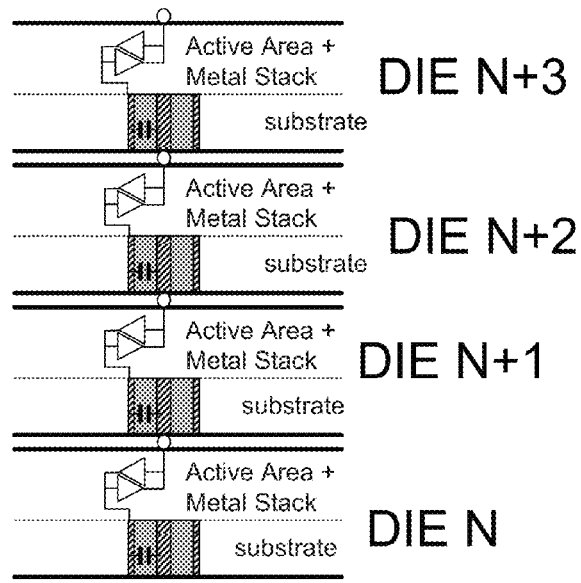
*FIG. 9*
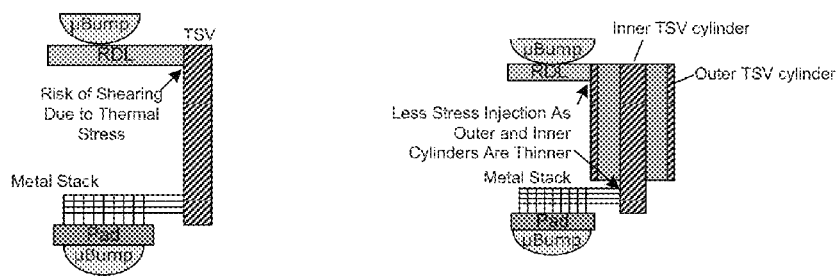
*FIG. 10*
*FIG. 11*

INTERLAYER COMMUNICATIONS FOR 3D INTEGRATED CIRCUIT STACK

RELATED APPLICATION AND CLAIM FOR PRIORITY

This application is a U.S. National Stage Filing under 35 U.S.C. § 371 from International Application No. PCT/US2011/054440, filed on 30 Sep. 2011, entitled "Interlayer Communications for 3D Integrated Circuit Stack" and published as WO 2013/048501 on 5 Oct. 2011, and which is incorporated here by reference in their entirety.

TECHNICAL FIELD

The present invention generally relates to integrated circuits and in particular, to so-called three dimensional integrated circuits.

BRIEF DESCRIPTION OF THE DRAWINGS

Embodiments of the invention are illustrated by way of example, and not by way of limitation, in the figures of the accompanying drawings in which like reference numerals refer to similar elements.

FIG. 7 is a conceptual view of 3D modules with AC coupled inter-layer communications using capacitors formed from coaxial interconnects in accordance with some embodiments.

FIG. 8 shows top and side cross-sectional views of coupling capacitors derived using coaxially aligned TSV cylinders in accordance with some embodiments.

FIG. 9 illustrates how buffers can be used for certain coupling capacitors in accordance with some embodiments.

FIGS. 10 and 11 highlight an advantage of using a coaxial interconnect structure with AC coupling in accordance with some embodiments.

DETAILED DESCRIPTION

Multiple dies can be stacked in what are commonly referred to as three-dimensional modules (or "stacks") with signal connections between the dies, resulting in an IC module with increased circuit component capacity.

Some embodiments provide capacitive AC coupling interlayer communications for 3D stacked modules. Capacitive AC coupling, e.g., tuned AC coupling, especially when taking into account the estimated or measured capacitive characteristics of conductor interconnects, may be well suited for 3D implementations, which are typically dominated by inductances and capacitances. With capacitive coupled communications, the stacked dies may be decoupled, from a DC standpoint, from each other, thereby allowing for independent bias conditions between the layers. With such AC coupling, point to point as well as point to multipoint signaling may effectively be implemented, which enables new opportunities in the area of inter-die communication. In addition, AC coupling may combine two advantages. First power consumption, will typically scale with frequency. Thus, little or no power may be consumed when there is no traffic on the interconnect. Second, it may improve energy efficiency and max bandwidth i.e. for high stacks with high capacitive load conditions as compared with, for example, low voltage DC coupling signaling approaches.

Figure 1:
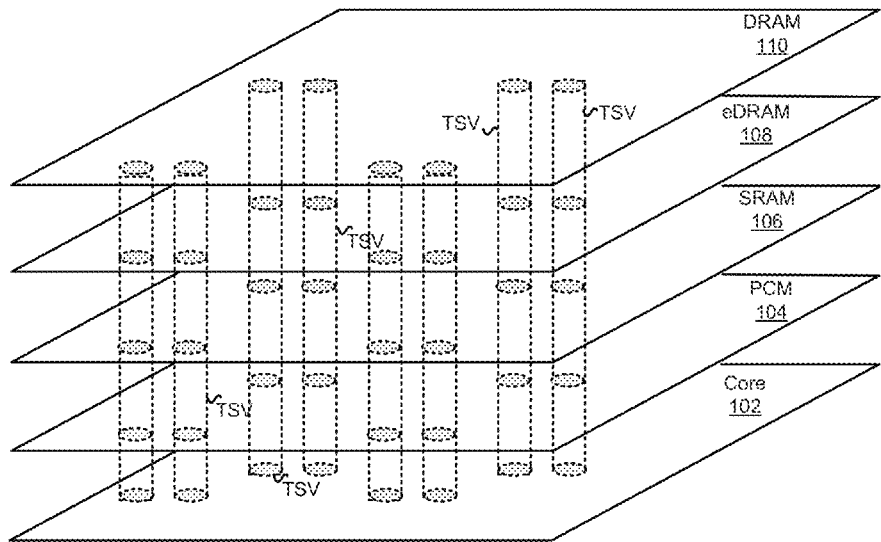
FIG. 1 shows a heterogeneous three-dimensional integrated circuit module.

FIG. 1 is a conceptual view of an exemplary heterogeneous 3D module for a computing device such as a mobile phone, portable personal computer, or a server computer. A heterogeneous module is a module that comprises two or more integrated circuit dies formed from two or more different processes, e.g., available transistor feature dimensions, supply levels, etc. For example, a process or technology for a core logic die would typically be different than that for a Flash memory die.

The depicted module has a core logic layer 102, PCM (phase change memory) layer 104, SRAM layer 106, eDRAM layer 108, and DRAM layer 110. It also has numerous conductive interconnects (through-silicon-vias "TSV"s in the depicted figure) for interconnecting signals and supply references between the different electronic layers. (TSVs may be of different lengths, widths and electrical characteristics, depending on the process of stacked dies, the functional, and loading requirements.) There may be other types of interconnect structures, as well, for implementing interconnections between the different layers. Moreover, while TSVs are shown and discussed, other suitable interconnect structures may be used for implementing AC coupled interconnects, which are addressed in the following sections.

(Note that eDRAM stands for embedded DRAM, a capacitor-based dynamic random access memory that can be integrated on the same die as an ASIC or processor. It is usually fairly leaky but faster than conventional DRAM. PCM stands for phase-change memory. It is a type of non-volatile computer memory. Currently, PCMs predominantly exploit the unique behavior of chalcogenide glass.)

Figure 2:
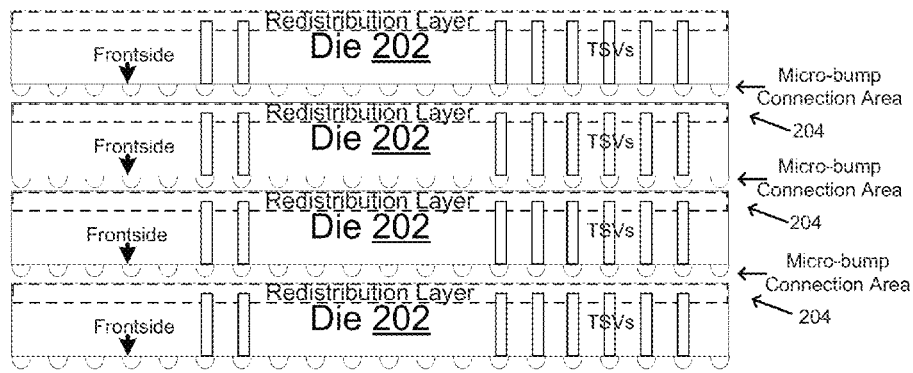
FIG. 2 is a side view of a heterogeneous 3D module in accordance with some embodiments.

FIG. 2 shows a side view of a portion of a 3D stack. It comprises die layers 202, mounted together through redistribution and micro-bump area layers 204. The redistribution layers are each formed from part of a die, while the micro-bumps (including pads, not shown) are disposed in between the dies.

This figure illustrates dies mounted front-side to back-side (e.g., the front-side active layers all face in the same direction, downward in the depicted figure), but in some implementations, other suitable schemes could be employed. Along these lines, the functional die layers could be in any suitable order, although it may be desirable to place layers generating the most heat (e.g., core/processor layer(s)) on an outer surface, e.g., top or bottom. Likewise, for improved bandwidth, different layers may be made to be closer to certain other layers to achieve faster transfer rates for higher priority channels.

Figure 3:
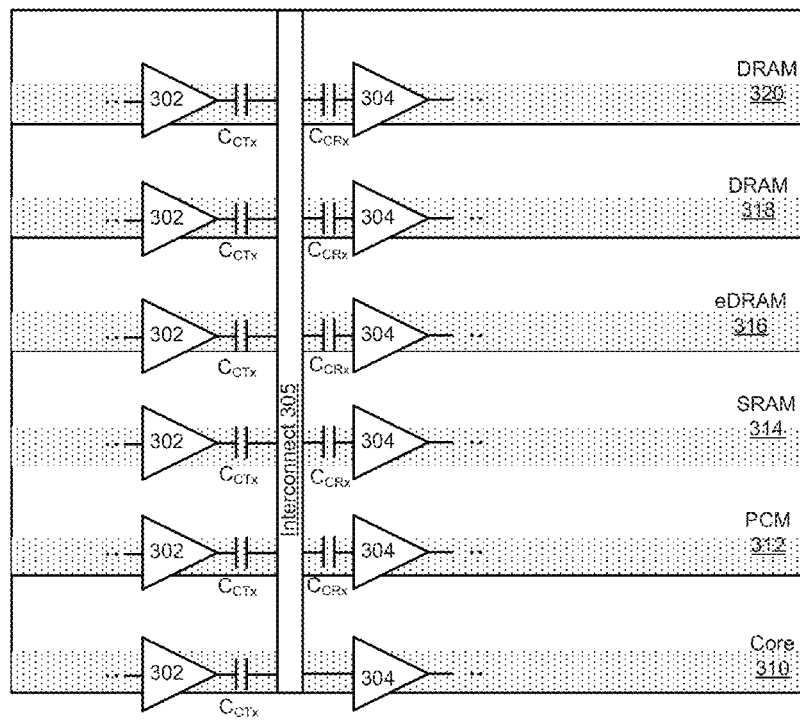
FIG. 3 is a conceptual view of a 3D module with AC coupled inter-layer communications in accordance with some embodiments.

FIG. 3 is a conceptual view showing an AC coupled, inter-layer link implementation for a bit line in accordance with some embodiments. Shown is an interconnect (e.g., TSV) 305 disposed through a core layer 310, a PCM layer 312, SRAM layer 314, eDRAM layer 316, and DRAM layers 318 and 320. (For simplicity, a single line is shown, but persons will appreciate that inter-layer links may comprise multiple lines for data, address, and/or control signals.)

In the depicted embodiment, each layer has a transmitter driver 302 coupled to the TSV through a transmitter coupling capacitor ($C_{CTx}$) and a receiver driver 304 coupled to the TSV through a receiver coupling capacitor ($C_{CRx}$). In the depicted embodiment, the receiver for the core layer 310 is directly connected to the data line in order to define its DC level. This may be well-suited for a parallel topology, allowing for communication between any two or more of the connected stacked layers. Thus, the other layer devices (the memory devices in this embodiment) are separated from each other from a DC standpoint, so they can generate their individually required DC bias levels locally without unduly affecting the other layers.

It should be appreciated that having the receivers in the core directly connected to the TSVs is just one implementation, but it is certainly not required. For example, all of the receivers and transmitter stages could be separated using capacitors, with the TSV chains being allowed to float or to be biased with an additional circuit. Along these lines, with some embodiments, coupling capacitances on the Rx sides may not be required. For example, if some or all of the receivers use the same DC voltage, coupling capacitors may be omitted on the receiver side, at least for Tx/Rx networks in the module with common receiver DC bias levels. So, different schemes could be employed. Coupling capacitors could be used at all receivers, or they could be used at all receivers except for a receiver that defines the DC level of the common interconnect (FIG. 3 embodiment). Alternatively, one or more network groups of receivers operating on the same DC level could omit coupling capacitors.

In this embodiment, the signal line is used for bi-directional signaling, although in other embodiments, separate lines could be used for unidirectional reception and transmission. Moreover, the concept can be applied to single-ended as well as for differential signaling schemes and can be used for point-to-point or point-to-multi-point links. It should also be noted that continuous or segmented (piecewise-connected in series from layer to layer) interconnects (TSVs, plated through holes, etc.) may be used for each line. Interconnects composed of more than one conductive segment will typically have different reactive (capacitive, inductive) characteristics when connected together in a piecewise fashion through conductive IC module traces.

Figure 4:
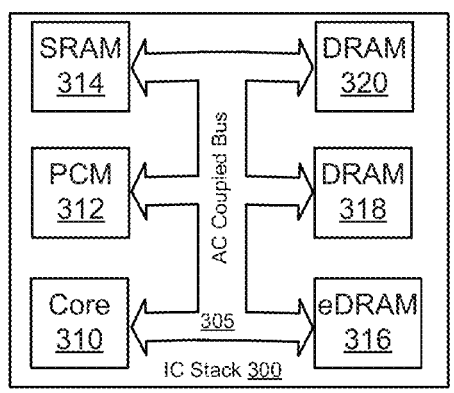
FIG. 4 is a block diagram showing a bus implementation for interconnect communications of FIG. 3 in accordance with some embodiments.

FIG. 4 is a block diagram showing inter-layer communication using an AC coupling bus implementation in accordance with some embodiments. It depicts the different layers linked together using a bus configuration. That is, each functional layer is coupled to a common bus, e.g., a bus with a number of data, control, and address interconnect lines. In other embodiments, dedicated point-to-point or point-to-multipoint, or combinations of dedicated and shared bus links could be implemented.

Figure 5:
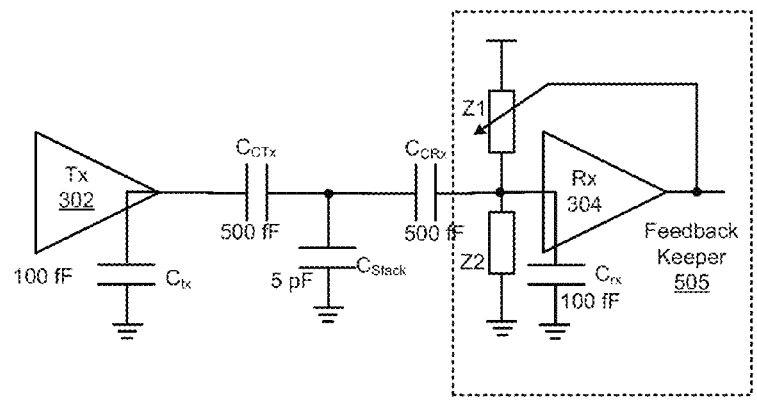
FIG. 5 is a schematic diagram showing capacitive coupling capacitances including exemplary reasonable values for a signal line coupled to an inter-layer conductive interconnect accordance with some embodiments.

FIG. 5 is a schematic diagram showing a portion of a transmitter-receiver link for the diagram of FIG. 3 in accordance with some embodiments. The coupling capacitors ($C_{CTx}$, $C_{CRx}$) are shown, along with equivalent transmitter and receiver capacitances ($C_{tx}$, $C_{rx}$). Also shown is the equivalent capacitance ($C_{Stack}$) for the interconnect (e.g., TSV) that is coupled to the transmitter and receiver (302, 304). (Note that the interconnect "stack" capacitance may arise from TSVs, ESD devices, micro bumps, metal stack components, redistribution layers and the like.)

Receiver 304 is shown, in this embodiment, implemented with a feedback keeper circuit 505, which includes impedance Z2 and variable impedance Z1, along with the receiver 304. For convenience and ease of understanding, exemplary capacitor values are also indicated.

With 3D modules having ever higher stacks, long TSV chains may occur, which can result in them having relatively high capacitive loads. Such capacitive loads may even be increased with point-to-multipoint configurations. Providing coupling capacitors (e.g., $C_{CTx}$, $C_{CRx}$ in FIG. 5) in series with the stack load can materially reduce the effective total capacitance between the receiver and transmitter.

From the standpoint of the transmitter 302, the coupling capacitors ($C_{CTx}$, $C_{CRx}$) effectively form voltage dividers relative to the interconnect capacitance ($C_{Stack}$) and the receiver decoupling capacitance ($C_{rx}$).

In some embodiments, the capacitance ratio of a first divider, $C_{CTx}$ to $C_{Stack}$, may particularly be considered. For example, with the exemplary capacitive values, it may be in the order of 1:10 (the ratio of $C_{CTx}$ to $C_{Stack}$), which corresponds to an impedance ratio of about 10:1, thereby reducing the full voltage swing level provided from the transmitter and seen by the receiver. For example, if the transmitter driver output signal has a swing magnitude of 1 V, then the swing level at the interconnect stack ($C_{Stack}$) node would be reduced down to about 100 mV. This may provide advantages regarding power dissipation and speed. In some embodiments, a second capacitance ratio ($C_{CRx}$ to $C_{Rx}$) may also be considered. In the depicted example, it is about 5:1. With this overall circuit, the AC coupling approach may be energy efficient for a wide frequency range, as it substantially avoids DC power consumption and at the same time reduces voltage swing at the channel capacitances.

Stack interconnects (e.g., TSVs) may also have parasitic inductances, e.g., in the range of about 10 to 50 pH. Such inductances may be considered, e.g., when selecting coupling capacitor values for the transmitters and receivers. For example, with channel capacitances (per stacked die) of typically 100 fF to 1 pF (taking into account coupling capacitors, stack capacitance, and receiver/transmitter capacitances) and with a stack parasitic inductance within the previously mentioned range, resonance frequencies of about 20 to 160 GHz may result. Such resonant frequencies supports attaining suitably high signaling cut-off frequencies through resonance peaking.

Figure 6:
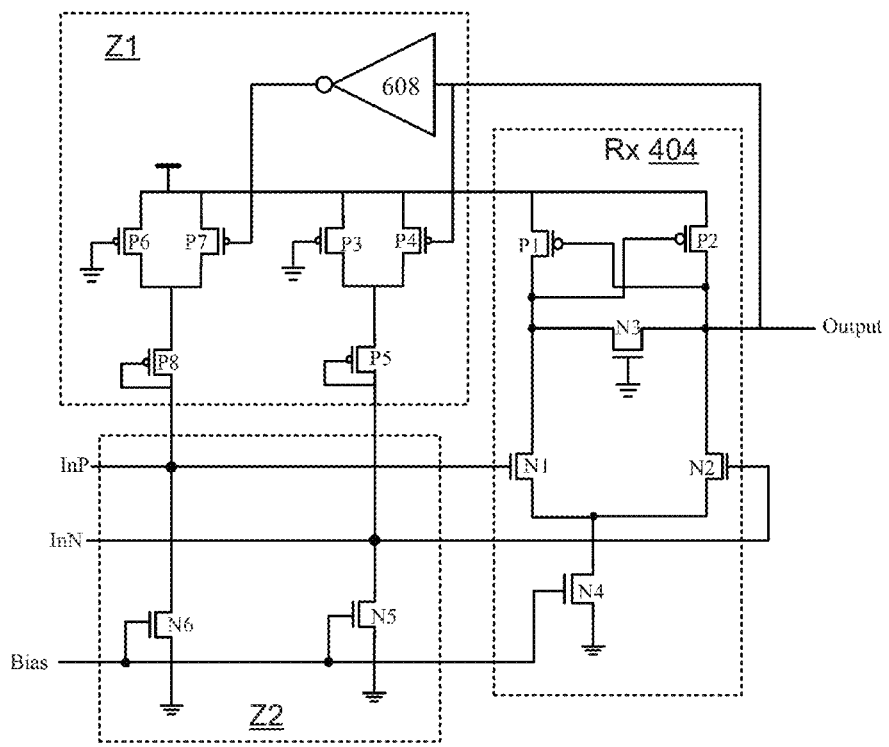
FIG. 6 is a schematic diagram showing a receiver circuit with a feedback keeper in accordance with some embodiments.

FIG. 6 shows an embodiment of a feedback keeper implementation that could be used for the feedback keeper 505 indicated in FIG. 5. It illustrates the feedback keeper principle for a differential signaling implementation. (Note that with this circuit, a differential sense amplifier is employed with a single-ended output (Output) that should typically be followed by a latch stage.) The circuit includes a receiver 404 comprising transistors P1, P2 and N1 to N4; impedance Z2 comprising transistors N5, N6; and controllable impedance Z1 comprising transistors P3, P4, P5, P6, P7, and P8, and inverter 608. The Z1 and Z2 transistors operate to generate DC bias voltages for the inputs (InP, InN) of receiver input transistors N1 and N2. Transistors N4, N5, and N6 function as current sources, controlled by bias signal (Bias), for impedances Z1, Z2 and the receiver driver 404. Transistors P5 and P8 function as resistors for impedance Z1.

There are two DC bias levels, a high and a low level, that may be generated by Z1 and Z2 at InP and depending on the logic state of the output (Output). If Output is High, then P7 turns on, which causes InP to be at the higher DC bias level and InN to be at the lower level. On the other hand, if the Output is at a logic low, then P4 turns on and InN is at the higher bias level while InP receives the lower bias level. The actual (analog) values for the lower and higher DC bias levels are determined by design choice parameters for P6-P8 and N6, as well as by the Bias signal level.

The additional DC offset at each input creates a differential DC input applied across the differential input (InP/InN) whose polarity depends on the output state of the receiver. It is configured for positive feedback, so that it will maintain a steady state at the receiver input even during long constant patterns. In most embodiments, the differential offset level should be smaller than the AC signal swing but higher than the resolution of the differential input. Accordingly, special DC balancing, coding, or scrambling mechanisms would not generally be required.

FIGS. 7-11 show additional embodiments that use coaxially configured interconnects (TSVs in the figure) for implementing coupling capacitors. They illustrate exemplary approaches for implementing the transmitter and/or receiver coupling capacitors. FIGS. 7 and 8 show embodiments with transmitter coupling capacitors implemented with coaxial interconnect capacitors, with other capacitor configurations used for receiver coupling capacitors. As shown in the top and side cross-sectional views of FIG. 8, with these embodiments, coupling capacitors may be derived from conductive plates coaxially disposed about inner TSV structures. FIG. 9 illustrates how buffers can be used for certain coupling capacitor approaches. FIGS. 10 and 11 highlight an advantage of using a coaxial interconnect structure with AC coupling. FIG. 10 shows a typical TSV implementation. With this design, there may be a risk of the TSV shearing away from the redistribution layer and/or micro-bump area, e.g., due to thermal stress. In contrast, the coaxial interconnect design of FIG. 11 avoids this problem. Less stress is incurred as outer and inner cylinders may be thinner, as compared with a DC coupled approach.

Figure 12:
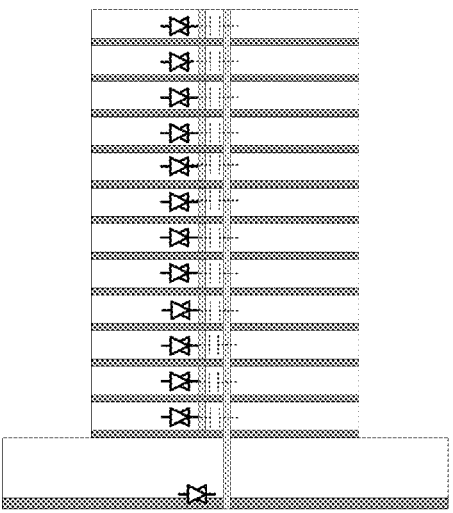
FIG. 12 shows an example of a coupling capacitor implemented with capacitance arising from two adjacent TSVs in accordance with some embodiments.
Figure 13:
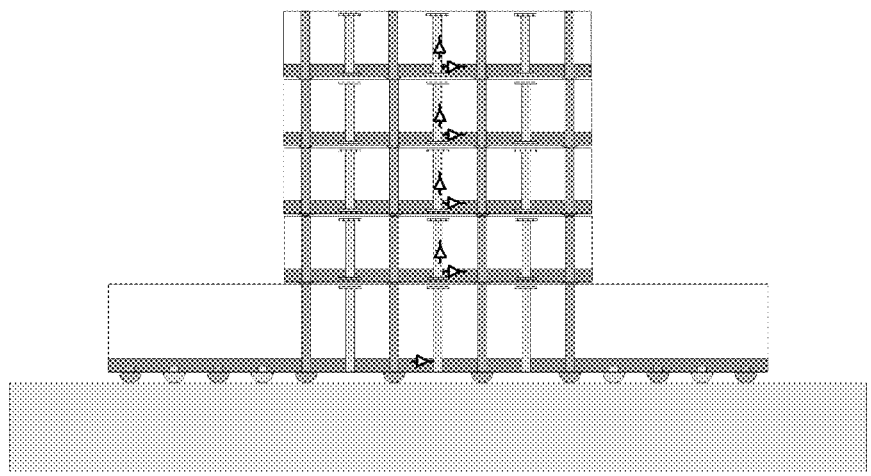
FIG. 13 shows an inter-die capacitor in accordance with some embodiments.

Coupling capacitors may be formed in other ways. For example, they may be formed from die boundary capacitors with, e.g., orders of about 500 fF capacitances. MIM capacitors and/or parasitic capacitances adjacent to the interconnect structures could be used. Capacitances may be implemented in other ways as well. For example, with reference to FIG. 12, they may be implemented with the capacitance arising from two adjacent TSVs. As shown in FIG. 13, inter-die capacitors could also be employed. Inter-die capacitors may be formed from metal pads of two adjacent dies. The pads lie upon each other and form a plate-type capacitor. However, with such capacitors, as with other embodiments, additional buffering may be desired.

It should be mentioned that interconnect shorts and opens can be significant factors for limiting desired yields for 3D stacks. Fortunately, with embodiments of the present invention, this can be mitigated with the use of test equipment links, which may be simplified as they can be implemented without the need for contacts through one or more of the AC coupling channels.

There may be several different benefits available for using AC coupling with 3D stacks, as taught herein. For example, different technologies with different bias requirements can be mixed conveniently since the DC biasing in the different layers can be decoupled from each other. In addition, in some embodiments, desired energy efficiency may be achieved for a wide frequency range. There may be very little (if not approaching zero) static power dissipation. Moreover, signaling bandwidth may be increased through capacitance reduction and resonance effects from parasitic interconnect inductances. A significant benefit may be that testing may be performed using contactless probing. This is in contrast to direct probing, which can damage a thinned wafer and thus can impact yield. Also, ESD problems are typically mitigated with contactless probing. It should be appreciated that with AC coupling, it is not required that a receiver is directly connected to a chain of TSVs.

In the preceding description and following claims, the following terms should be construed as follows: The terms "coupled" and "connected," along with their derivatives, may be used. It should be understood that these terms are not intended as synonyms for each other. Rather, in particular embodiments, "connected" is used to indicate that two or more elements are in direct physical or electrical contact with each other. "Coupled" is used to indicate that two or more elements co-operate or interact with each other, but they may or may not be in direct physical or electrical contact.

The invention is not limited to the embodiments described, but can be practiced with modification and alteration within the spirit and scope of the appended claims. For example, unidirectional, as well as bi-directional, configurations could be employed. Two data lines per bit could be used.

It should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

It should also be appreciated that in some of the drawings, signal conductor lines are represented with lines. Some may be thicker, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, and/or single-ended lines.

It should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS., for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. An apparatus, comprising:
two or more stacked die layers with active surfaces facing in the same direction;
at least one interconnect passing through the two or more stacked die layers and having an associated capacitance; and
at least one receiver on at least one of the stacked die layers and at least one transmitter on at least one of the stacked die layers, wherein the at least one transmitter is coupled to the at least one interconnect through a coupling capacitor, the at least one transmitter and receiver to be coupled to each other through the at least one interconnect via AC coupling, wherein the at least one receiver comprises a feedback keeper circuitry.

2. The apparatus of claim 1, wherein the feedback keeper circuitry comprises controllable impedance.

3. The apparatus of claim 1, wherein the at least one receiver is a differential receivers.

4. The apparatus of claim 1, wherein the at least one interconnect includes a through-silicon-via.

5. The apparatus of claim 1, wherein the at least one interconnect includes a piecewise-connected through-silicon-via.

6. The apparatus of claim 1, wherein the coupling capacitors are formed from conductive pieces coaxially disposed about the at least one interconnect.

7. The apparatus of claim 1, wherein the coupling capacitor has capacitance less than the associated interconnect capacitance.

8. The apparatus of claim 1, comprising at least one receiver directly coupled to the at least one interconnect without the use of a coupling capacitor.

9. The apparatus of claim 1, comprising at least one transmitter directly coupled to the at least one interconnect.

10. The apparatus of claim 1, wherein the two or more stacked die layers comprise a core logic layer and one or more memory layers using different DC biasing levels isolated from each other by coupling capacitors.

11. An apparatus, comprising:
two or more stacked die layers with active surfaces facing in the same direction;
at least one interconnect passing through the two or more stacked die layers and having an associated capacitance; and
receivers and transmitters on the two or more stacked die layers, wherein at least one of the receivers is coupled to the at least one interconnect through a coupling capacitor, the transmitters and receivers to be coupled to each other through the at least one interconnect via AC coupling, wherein the at least one receiver comprises a feedback keeper circuitry.

12. The apparatus of claim 11, wherein the feedback keeper circuitry comprises a controllable impedance.

13. The apparatus of claim 11, wherein the transmitter coupling capacitors have capacitances less than the associated interconnect capacitance.

14. The apparatus of claim 11, wherein at least one of the transmitters is coupled to the at least one interconnect through a coupling capacitor.

* * * * *